United States Patent
Humblet

(10) Patent No.: US 10,505,676 B1
(45) Date of Patent: *Dec. 10, 2019

(54) SYSTEM, METHOD, AND APPARATUS FOR INTERLEAVING DATA

(71) Applicant: Acacia Communications, Inc., Maynard, MA (US)

(72) Inventor: Pierre Humblet, Cambridge, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,400

(22) Filed: Aug. 13, 2018

Related U.S. Application Data

(60) Provisional application No. 62/717,770, filed on Aug. 10, 2018.

(51) Int. Cl.
*H04L 1/00* (2006.01)
*H03M 13/25* (2006.01)
*H03M 13/27* (2006.01)

(52) U.S. Cl.
CPC ........ *H04L 1/0071* (2013.01); *H03M 13/251* (2013.01); *H03M 13/271* (2013.01); *H04L 1/0041* (2013.01)

(58) Field of Classification Search
CPC ... H04L 1/0041; H04L 1/0061; H04L 1/0071; H03M 13/251; H03M 13/271; H03M 13/2775; H03M 13/2957; H03M 13/15; H03M 13/2703
See application file for complete search history.

(56) References Cited

U.S. PATENT DOCUMENTS

| | | | |
|---|---|---|---|
| 4,295,218 A | 10/1981 | Tanner | |
| 5,563,897 A | 10/1996 | Pyndiah | |
| 8,276,047 B2 | 9/2012 | Coe | |
| 8,751,910 B2 | 6/2014 | Farhoodfar | |
| 8,959,418 B1 | 2/2015 | Pfister | |
| 9,112,529 B1 | 8/2015 | Mazahreh | |
| 2009/0113271 A1* | 4/2009 | Bae | H03M 13/2775 714/752 |

FOREIGN PATENT DOCUMENTS

EP  1396954 A1  3/2004

OTHER PUBLICATIONS

Namboodiri et al., Physical layer network coding for two-way Relaying with QAM and Latin Squares, IEEE, pp. 2286 to 2292 (Year: 2012).*
Kim et al., Collision-free interleaver composed of a Latin square for parallel architecture turbo codes, IEEE, Communications Letters , vol. 12, No. 3, pp. 203 to 205. (Year: 2008).*
Golomb et al., Optimal interleaving schemes for two dimensional arrays, IEEE, Tans. on Info. Theory, vol. 52, No. 9, pp. 4223 to 4229. (Year: 2006).*
European Search Report and Annex received for EP Application No. 18213428.8, dated Feb. 20, 2019, 16 pages.

(Continued)

*Primary Examiner* — Shelly A Chase
(74) *Attorney, Agent, or Firm* — Joseph D'Angelo

(57) ABSTRACT

A method, system, and apparatus for interleaving data including creating a buffer, writing input data, and reading output data out of the buffer.

20 Claims, 11 Drawing Sheets

(56) References Cited

OTHER PUBLICATIONS

Northcott, P., "Cyclically Interleaved BCH Swizzle FEC for OTU4 IrDI and Optionally IaDI," PMC-Sierra, Burnaby, BC, Canada, Milpitas Meeting Mar. 16-20, 2009, XP044039pp.1-8.

Wang, J. et al., "Performance Bounds on Product Codes with Hyper-Diagonal Parity," 2000 Conf. on Inf. Sci. & Sys., Princeton Univ., XP-001034704, Mar. 2000, pp. WP7-1-WP7-6.

Smith, B.P. et al., "Staircase Codes: FEC for 100 Gb/s OTN," IEEE/OSA Journal of Lightwave Technology, DOI 10.1109/JLT. 2011.2175479, Jan. 2012, pp. 1-8.

Feltstrom, A.J. et al., "Braided Block Codes," IEEE Transactions on Information Theory, vol. 55, No. 6, DOI 10.1109/TIT.2009. 2018350, Jun. 2009, pp. 2640-2658.

Tzimpragos, G. et al., "A Survey on FEC Codes for 100G and Beyond Optical Networks," IEEE Communications Surveys & Tutorials, DOI 10.1109/COMST.2014.2361754, 2014, pp. 1-15.

Bahl et al., Optimal decoding of linear codes for minimizing symbol error rate. IEEE Trans on Info Theory. Mar. 1974;20:284-287.

Chase, A class of algorithms for decoding block codes with channel measurement information. IEEE Trans on Info Theory. Jan. 1972;18:I 70-182.

Cola Volpe et al., Extrinsic information in iterative decoding: A unified view. IEEE Trans on Comm. Dec. 2001;49(12):2088-94.

Cuevas et al., New architecture for high data rate turbo decoding of product codes. IEEE Proc of Globecom'02. Nov. 17-21, 2002; v2:1363-67.

Feltstrom et al., Braided block codes. IEEE Trans on Info Theory. Jun. 2009;55(6):2640-58.

Jian et al., Iterative hard-decision decoding of braided BCH codes for high-speed optical communication, IEEE Proc of Globecom' 13. Dec. 9-13, 2013;23 7 6-81.

Johansson et al., A simple one-sweep algorithm for optimal App symbol decoding of linear block codes. IEEE Trans on Info Theory. Nov. 1998:44(7):3124-29.

Pyndiah et al., Near optimum decoding of product codes. Proc IEEE GLOBECOM'94 Conf, Nov.-Dec. 1994;I/3:339-343.

Pyndiah, Near-optimum decoding of product codes: Block turbo codes. IEEE Trans on Comm. Aug. 1998;46(8):1003-10.

Truhachev et al., On braided block codes. Proc IEEE Int Symp Info Theon. Jun. 29-Jul. 4, 2003; 32.

Zigangirov et al., Encoders and decoders for braided block codes. Proc IEEE Int Symp Info Theory. Jul. 9-14, 2006;1808-12.

\* cited by examiner

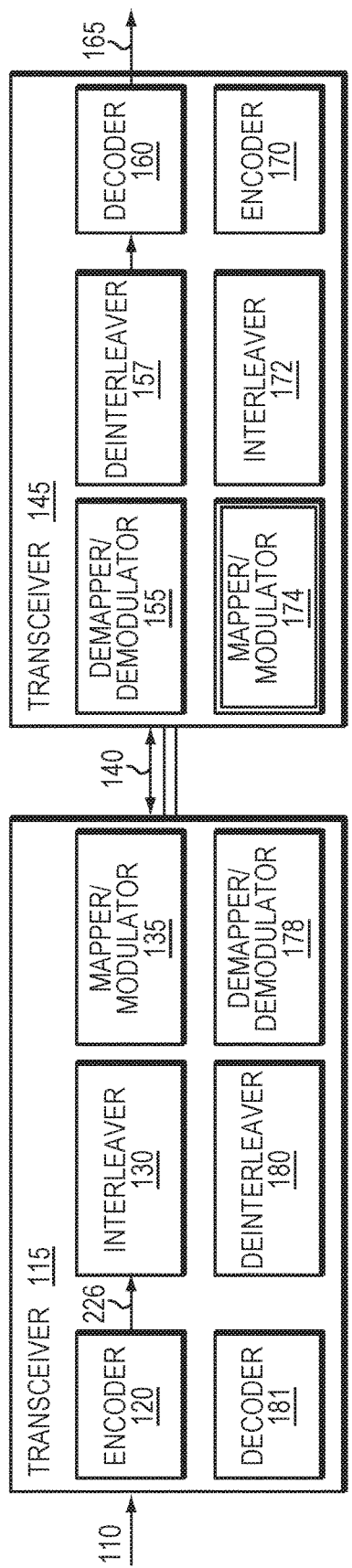
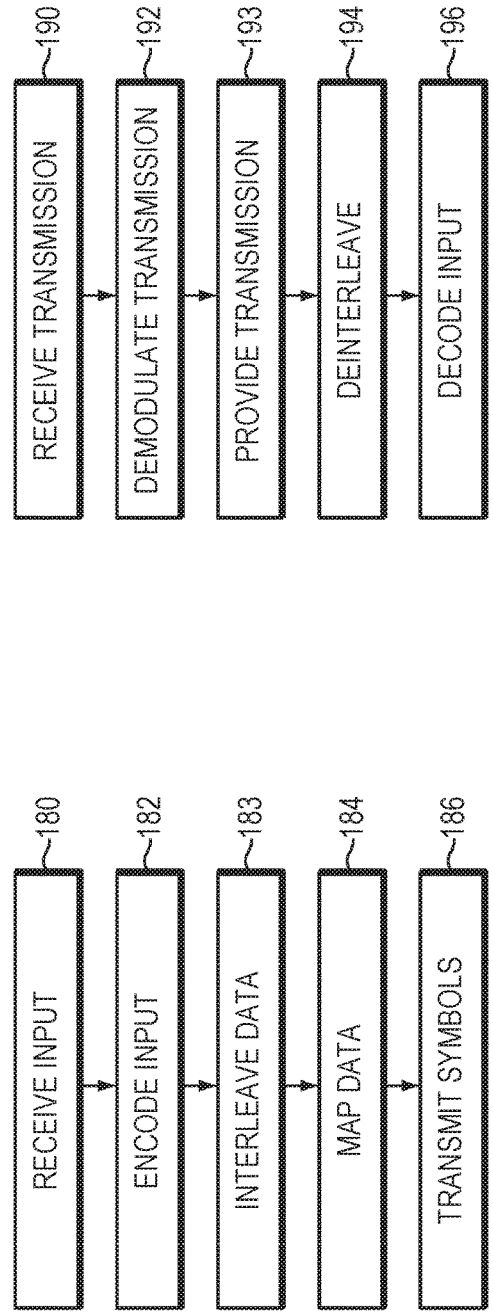
FIG. 1A
FIG. 1B
FIG. 1C

FIG. 3

| SUBSET NUMBER | ROW BLOCKS |
|---|---|
| 0 | 0, 2, ..., 40 |
| 1 | 1, 3, ..., 41 |
| 2 | 42, 44, ..., 82 |
| 3 | 43, 45, ..., 83 |

| 3 | 2 | 1 | 0 | 3 | 2 | 1 | 0 | 3 | 2 | 1 | 0 | 3 | 2 | 1 | 0 |
|---|---|---|---|---|---|---|---|---|---|---|---|---|---|---|---|
| 2 | 1 | 0 | 3 | 2 | 1 | 0 | 3 | 2 | 1 | 0 | 3 | 2 | 1 | 0 | 3 |
| 1 | 0 | 3 | 2 | 1 | 0 | 3 | 2 | 1 | 0 | 3 | 2 | 1 | 0 | 3 | 2 |
| 0 | 3 | 2 | 1 | 0 | 3 | 2 | 1 | 0 | 3 | 2 | 1 | 0 | 3 | 2 | 1 |
| 3 | 2 | 1 | 0 | 3 | 2 | 1 | 0 | 3 | 2 | 1 | 0 | 3 | 2 | 1 | 0 |
| 2 | 1 | 0 | 3 | 2 | 1 | 0 | 3 | 2 | 1 | 0 | 3 | 2 | 1 | 0 | 3 |
| 1 | 0 | 3 | 2 | 1 | 0 | 3 | 2 | 1 | 0 | 3 | 2 | 1 | 0 | 3 | 2 |
| 0 | 3 | 2 | 1 | 0 | 3 | 2 | 1 | 0 | 3 | 2 | 1 | 0 | 3 | 2 | 1 |
| 3 | 2 | 1 | 0 | 3 | 2 | 1 | 0 | 3 | 2 | 1 | 0 | 3 | 2 | 1 | 0 |
| 2 | 1 | 0 | 3 | 2 | 1 | 0 | 3 | 2 | 1 | 0 | 3 | 2 | 1 | 0 | 3 |
| 1 | 0 | 3 | 2 | 1 | 0 | 3 | 2 | 1 | 0 | 3 | 2 | 1 | 0 | 3 | 2 |
| 0 | 3 | 2 | 1 | 0 | 3 | 2 | 1 | 0 | 3 | 2 | 1 | 0 | 3 | 2 | 1 |
| 3 | 2 | 1 | 0 | 3 | 2 | 1 | 0 | 3 | 2 | 1 | 0 | 3 | 2 | 1 | 0 |
| 2 | 1 | 0 | 3 | 2 | 1 | 0 | 3 | 2 | 1 | 0 | 3 | 2 | 1 | 0 | 3 |
| 1 | 0 | 3 | 2 | 1 | 0 | 3 | 2 | 1 | 0 | 3 | 2 | 1 | 0 | 3 | 2 |
| 0 | 3 | 2 | 1 | 0 | 3 | 2 | 1 | 0 | 3 | 2 | 1 | 0 | 3 | 2 | 1 |

FIG. 8

| MOD | MEAN | MIN | MAX |
|---|---|---|---|
| QPSK | 64 | 64 | 64 |
| 8 QAM | 42.66 | 37 | 46 |
| 16 QAM | 32 | 32 | 32 |

FIG. 9

SYSTEM, METHOD, AND APPARATUS FOR INTERLEAVING DATA

RELATED APPLICATIONS

This application claims the benefit of U.S. provisional patent application 62/717,770, titled "Interleaver," which is incorporated by reference in its entirety for all purposes. This application is related to U.S. patent application Ser. No. 15/637,808, titled "FORWARD ERROR CORRECTION SYSTEMS AND METHODS," which is incorporated by reference in its entirety for all purposes.

BACKGROUND

An interleaver is often used in certain types of communication systems

BRIEF DESCRIPTION OF THE FIGURES

Various aspects and embodiments of the application will be described with reference to the following example embodiments. It should be appreciated that the figures are not necessarily drawn to scale.

FIG. 1a is a simplified illustration of an optical communication system, in accordance with an embodiment of the present disclosure;

FIG. 1b is a simplified method for transmitting information in a communication system, in accordance with an embodiment of the present disclosure;

FIG. 1c is a simplified method for receiving information in a communication system, in accordance with an embodiment of the present disclosure;

FIG. 3 is an illustration of a table for intra-block interleaving, in accordance with an embodiment of the present disclosure;

FIG. 5 is a simplified illustration of portioning a buffer into 4 subsets, in accordance with an embodiment of the present disclosure;

FIG. 7 is a simplified illustration of a table showing a bit index in an output group for encoded bits in a block for 16 QAM, in accordance with an embodiment of the present disclosure;

FIG. 8 is a simplified illustration of a table showing a bit index in an output group for encoded bits in a block for QPSK, in accordance with an embodiment of the present disclosure;

FIG. 9 is a simplified illustration of a table showing occurrences of symbol bits per constituent codeword for different modulations, in accordance with an embodiment of the present disclosure;

SUMMARY

Figure 2:
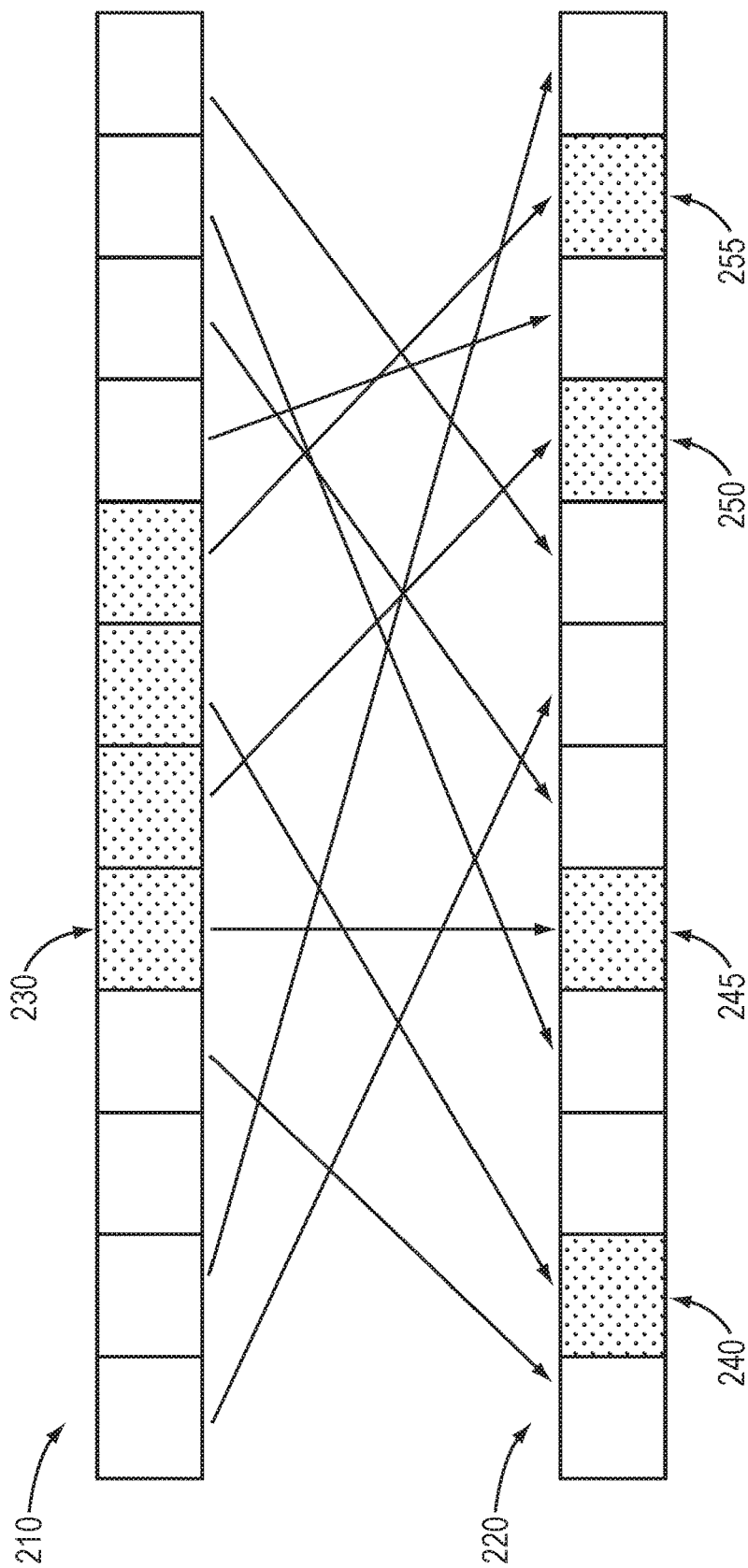
FIG. 2 is a simplified illustration of spreading out an error burst, in accordance with an embodiment of the present disclosure.

A method, system, and apparatus for interleaving data.

DETAILED DESCRIPTION

In some embodiments, a communication system may transmit data from a transmitter to a receiver over a communication link. In many embodiments, a communication link may be exposed to environmental conditions that may interfere with data transmitted over a communication link. In certain embodiments, a way to correct for interference over a communication link may be to use an encoder on a transmission side of a communication link. In most embodiments, a way to correct for interference over a communication link may be to use a decoder on a receiver side of a transmission link. In some embodiments, an error correction code used by an encoder and decoder may be composed of smaller "constituent codes." In most embodiments, an error correction code may add redundant bits to specific information bits that may allow recovery of some or all the information when one or more of the information bits has become corrupted. In different embodiments, the amount of corrupted information that may be recovered may depend on the amount of additional or redundant bits added to information bits. In certain embodiments, a code word may be an element of a particular code. In a particular embodiment, for example, a size 1024×1024 Product Code may be a square array of bits where each row and each column form a constituent code of size 1024. In many embodiments, a way to correct for interference over a communication link may be to use an interleaver on a transmitter side of a transmission link. In many embodiments, a way to correct for interference over a communication link may be to use a deinterleaver on a receiver side of a transmission link.

In many embodiments, an encoder may encode data to be transmitted over a communication link. In most embodiments, a decoder may decode data that has been received over a transmission link. In certain embodiment, an interleaver may change the order of data to be transmitted over a link. In many embodiments, a deinterleaver may reverse a change of order of data received over a link.

Often, a transmitter may use a modulation scheme for data to be transmitted using a signal to a receiver. Conventional modulation schemes associate data bits with symbols. Quadrature amplitude modulation (QAM) is one example type of a typical type of modulation scheme and is commonly used in many communication systems including fiber optical and digital radio communications. Generally, the number of different symbols in a modulation format determines the order of a digital communication scheme. Conventionally, higher order modulation formats enable carrying more bits of information or parity bits per symbol. Usually, by selecting a higher order format of QAM, the data rate of a link can be increased.

Conventionally, a QAM scheme may be associated with a constellation diagram having M points arranged in a two-dimensional plane. Usually, the M points represent the M possible symbols to which data bits may be mapped, where M is an integer. For example, an 8QAM scheme may be associated with a constellation diagram having 8 points arranged in a two-dimensional plane representing 8 possible symbols to which data bits may be mapped. As another example, in conventional 16QAM, data bits are mapped to 16 different symbols. Generally, each particular one of the M points may be associated with a label indicating the bit sequence mapped to the symbol represented by the particular one point. For example, a particular one of the 8 points in a constellation diagram for 8 QAM may be associated with a label (e.g., "010") indicating that data bits "010" are mapped to the symbol represented by the particular one point. Typically, in the presence of noise those 3 bits may exhibit different error probabilities, so they are in different reliability classes. Conventional examples of QAM schemes include 8QAM, 16QAM, 32QAM, 64QAM, and 256QAM schemes. Other conventional modulation schemes include BPSK and QPSK.

Typically, in communication systems, data transmitted over a link may be subjected to an environmental condition that may cause interference for a period of time and then cease to cause interference. Generally, the interference for a period of time may cause the data within that period of time to be corrupted so that the data may not be recovered using error checking information encoded in the data. Usually, if data is reordered, such that errors due to interference is spread out over a greater period of time, then the errors may be corrected. In a particular example, if an error occurring for 1 second over 10 seconds of transmitted data was changed to instead occur across the 10 seconds of data, then the amount of error per second of data transmitted can be reduced by a factor of 10. In most embodiments, use of an interleaver and deinterleaver may enable errors to be distributed across more data instead of being concentrated in the portion of time where the error occurred.

In certain embodiments, interleaving may be a process of determining an order of transmission of bits from an encoder when transmitting the bits on the Horizontal and Vertical polarizations of optical channels, where the Horizontal and Vertical polarization may exhibit different signal to noise ratios and error rates, so bits transmitted over them are also in different reliability classes. In many embodiments, an interleaver may insure bursts of errors do not cause decoding failures. In some embodiments, an interleaver may insure that bits from H and V symbols appear equally in constituent codes. In certain embodiments, an interleaver may insure that bits in each reliability class (in higher order modulations) are balanced in constituent codes. In many embodiments, an interleaver may insure that bits with correlated errors (in non-Gray mapped constellations) appear in different constituent codes.

In many embodiments, an interleaver buffer may refer to a set of bits that the interleaver interleaves or changes the order of in a given period of time. In a particular embodiment, an interleaver buffer size may be 172,032 bits. In some embodiments, 172,032 bits may be organized as an (84, 8) array of 16×16 bit blocks. In certain embodiments, an intra-block interleaver may reorder bits in 16×16 blocks to insure that the bits in each row and column of a block of an encoder output are remapped almost uniformly in a block for transmission on the line. In many embodiments, an inter-block interleaver may cause nearby symbols on a line to contain bits that are widely separated in an encoder output.

In some embodiments, a full rate interleaver may be fed by two half data rate encoders, 0 and 1. In some embodiments, successive rows of blocks from a first encoder 0 may be written in even block rows of an interleaver buffer. In many embodiments, successive rows of blocks from a second encoder may be written in odd block rows. In certain embodiments, a content of an interleaver buffer may be a row by row interleaving of vertical segments of from matrices of a first encoder and a second encoder, for example Product Code encoders. In some embodiments, a matrix of an encoder may be infinite as the data being encoded by the encoder may not have a defined end point.

In some embodiments, intra-block interleaving may be specified by a table, which may indicate a row and column of a source bit for each destination bit in the block. In a particular embodiment, for example, a table may specify that bit (14, 15) of an interleaver input block (i.e. encoder output block) may be placed in row 1 (base 0) of column 0 of a corresponding interleaver buffer block.

In certain embodiments, an intra-block permutation may be applied to blocks in a buffer as it comes in from an encoder. In some embodiments, a buffer may be partitioned in an upper half of 42 rows and a bottom part of 42 block rows. In many embodiments, a buffer may be partitioned into 4 subsets, each containing 21×8 blocks or 336×128 bits. In certain embodiments, a first subset may contain row blocks 0, 2, . . . , 40. In those certain embodiments, a second subset may contain row blocks 1, 3, . . . , 41. In those certain embodiments, a third subset may contain row blocks 42, 44, . . . , 82. In those certain embodiments, a fourth subset may contain row blocks 43, 43, . . . , 83.

In certain embodiments, on output, groups of 8 bits may be taken in turn from each subset, reading them out of a column of bits before proceeding to the next columns of bits.

In some embodiments, a first 8 bits may be read from the top of a first column (i.e. column 0) of a first subset, then a first 8 bits from a first column of a second, third, and forth subset. In many embodiments, the first 8 bits from four subsets may be followed by taking a next 8 bits in the first column of a first, second, third, and fourth subsets. In many embodiments, after 42 cycles of reading 4×8 bits each, a first bit column of an interleaver buffer may be completely read out, and an output process may continue by reading bit columns 1 to 127.

In most embodiments, reading by columns of bits may be superior to reading by rows. In some embodiments, interleaver columns may be much longer than rows, and thus bits in a column may be spread over more constituent codes than bits in a row. In certain embodiments, reading columns when columns are longer than rows may increase a tolerance to long bursts or errors. In some embodiments, if a burst of errors of length 84×16×2 starts on a block boundary in the first subset, there may be two errors per row (i.e. after the intra-block block permutation). In certain embodiments, there may be two errors per row per constituent code (i.e. before the intra-block block permutation and after the inverse intra-block permutation in a deinterleaver) if a burst of errors starts on a block boundary in the first subset when a Latin square property exists for the block. In most embodiments, if a burst of errors occurs within an interleaver block starting on a block boundary in the first subset, this may be within the correction capability of a constituent code hard decoder. In some embodiments, if a burst of a length indicated herein does not start on a block boundary in the first subset some edge effects may occur. In a particular embodiment, for example, if a burst of length indicated above starts in row 7 (base 0) of column 0 of a block, it may end in row 6 of col 2 of the same block. In a particular example, bits (0, 8), (1, 15), and (2, 0), which are in a burst for this example, originate in the same row 2, thus in the same constituent codeword, and the burst may not be corrected. In certain embodiments, one may verify certain edge effects may disappear if the burst length is reduced by 7 bits. In some embodiments, a burst correction capability of a system may be at least 84×16×2−7=2681 bits. In some embodiments, data read out of an interleaver may be passed to a modulator where the bits may be used in groups of S=2, 3 or 4, for QPSK, 8QAM and 16QAM respectively in both the H and V polarizations. In some embodiments, it may be helpful to assume that each of the 2 S bit indices (the factor 2 accounts for H and V) are in a separate reliability class indexed from 0 to 2 S−1. In most embodiments, output bits with even index may be used to form symbols for the H polarization, while those in odd positions may be used to determine symbols in the V polarization. In some embodiments, using an even/odd index rule may make it easy for a decoder to estimate a bit error rate in each polarization independently of a modulation.

In some embodiments, it may be beneficial to balance symbol bits in each reliability class in each constituent code word. In certain embodiments, each bit in a group of 8, each coded bit may be mapped. In certain embodiments, each row and each column may be mapped uniformly on all possible positions. In some embodiments, an even mapping may imply that each constituent codeword is mapped uniformly to H and V symbols, and that for QPSK and 16 QAM bits in each constituent codeword are mapped uniformly to all reliability classes of symbol bits. In most embodiments, a symbol bit may refer to the bit label or bits associated with a particular point or symbol in a constellation.

In certain embodiments, with 4 subsets, consider 8 QAM (6 bits per H/V symbol) where a first column of the first block in set may be 0. In these certain embodiments, successive transmitted symbol bits may be in reliability classes 0, 1, 2, 3, 4, 5, 0, 1|2, 3, 4, 5, 0, 1 2 3. In these embodiments, there may be no discontinuity at the location marked with "|", at the end of a first group of 8, as the groups of 8 in the 3 other sets add up to 24 bits, which is a number divisible by 6. In these embodiments, the number of bit rows in the interleaver buffer may be divisible by 6, so all the columns in the first row of blocks may have the same composition, and the same general phenomenon may appear throughout the buffer. In these certain embodiments, after the intra-block deinterleaving these numbers may be distributed throughout the blocks. In these certain embodiments, 4 of the 6 possible indices may appear three times and 2 may appear twice in each row of a block, and this may repeat in all constituent codewords. In these certain embodiments, a ratio of the least used symbol bit to the most used symbol bit may be as small as 2:3 the constituent codewords.

In some embodiments, some parts of constituent codes may be offset vertically by four blocks (or 64 bits) compared to the previous part. In certain embodiments, an offset may be caused of 64 mod 6=4 when moving from part to part. In many embodiments, an offset may balance a distribution within a constituent codeword, and make the ratio closer to (2+3):(3+3)=5:6 if the parts with an offset represent half of the whole constituent code.

In certain embodiments, there may be a mean, minimum and maximum numbers of occurrences of a bits in each reliability class in a constituent code for modulations of interest. In some embodiments, an ideal balance may be when a minimum and maximum are equal to a mean. In certain embodiments, a codeword may have 256 bits. In some embodiments, for QPSK, the mean, max, and min may be 64. In many embodiments, for 8QAM, the mean may be 42.66, the min may be 37, and the max may be 46. In other embodiments, for 16-QAM, the mean, max, and min may be 32. In some embodiments, the deviations from the mean may be close to the standard deviation produced by a random interleaver. In particular embodiments, the worst case may not be far from a mean and no significant differences in decoder performance may be observed compared to a random interleavers. In certain embodiments, spatial coupling between intersecting constituent codes may contribute to the averaging process during iterative decoding.

Refer now to the example embodiment of FIG. 1a. FIG. 1a is a simplified example embodiment of an optical system with a link and two transceivers, each transceiver with an encoder, decoder, mapper modulator, decoder, demapper, and demodulator. In FIG. 1a, optical transceiver 115 has encoder 120, interleaver 130 and mapper/modulator 135. As well, transceiver 115 has demapper/demodulator 178, deinterleaver 180, and decoder 181. In the example embodiment of FIG. 1a, each functionality is shown as a separate box, however in alternative embodiments functionality may be combined or shared depending on design.

Referring back to the example embodiment of FIG. 1a, encoder 120 receives input signal 110 (step 180). Encoder 120 encodes input signal 110 to generate a plurality of bits 126 (step 182). Interleaver 130 interleaves the bits (step 183). Mapper/Modulator 135 modulates light to send the plurality of signals across link 140 to transceiver 145 (step 186).

Transceiver 145 has demapper/demodulator 155, interleaver 157, and decoder 260. Demapper/demodulator 155 receives the symbols from optical link 140 (step 190). Demapper/demodulator 155 associates the received symbols with a plurality of bits (step 192). Demapper/demodulator 155 provides the plurality of bits to deinterleaver 157 (step 193). Deinterleaver 157 deinterleaves the data (step 194). Decoder 160 decodes the bits (step 196). Transceiver 145 also has encoder 170, interleaver 172 and mapper/modulator 174. Encoder 170, interleaver 172, and mapper modulator 175 act in a similar manner to encoder 120, interleaver 130, and mapper/modulator 135 at Transceiver 115. Similarly, decoder 181, deinterleaver 180 and demodulator/demapper 178 of Transceiver 115 function similarly to demapper/demodulatore 155, interleaver 157, and decoder 160 of transceiver 145.

In the illustrative embodiment of FIG. 1a, modulator 135 is able to transmit the plurality of symbols optical link 240 by modulating the plurality of symbols onto a carrier light wave with 2 polarizations, which propagates over optical communications link 140. In the illustrative embodiment of FIG. 1a, mapper/modulator 135 may be enabled to associate the plurality of bits 110 with symbols 124 according to a QAM format.

In certain embodiments, an encoder such as encoder 120 of FIG. 1a, may generate a plurality of bits from an input signal using a turbo product code (TPC). In some embodiments, an encoder such as encoder 120 of FIG. 1a, may generate a plurality of bits from an input signal using a convolutional low-density parity check code (LDPC). In further embodiments, an encoder such as encoder 120 of FIG. 1a, may generate a plurality of bits from an input signal using any suitable forward error correction code. In many embodiments, a plurality of bits may include parity bits generated by an encoder. In certain embodiments, an encoder may be implemented in hardware as circuitry. In some embodiments, an encoder may be implemented as part of an application-specific integrated circuit (ASIC).

Refer now to the example embodiment of FIG. 2, which illustrates a burst error with interleaved data. Data transmission 210 represents has been exposed to burst error 230. In FIG. 2, data mapping 220 represents the deinterleaved data of data transmission 210. In FIG. 2, bust error 230 has, through a deinterleaving process, been spread out to be errors 240, 245, 250, and 255. In most embodiments, spreading out a burst error across more data may enable better error recovery from the burst error.

Figure 3:
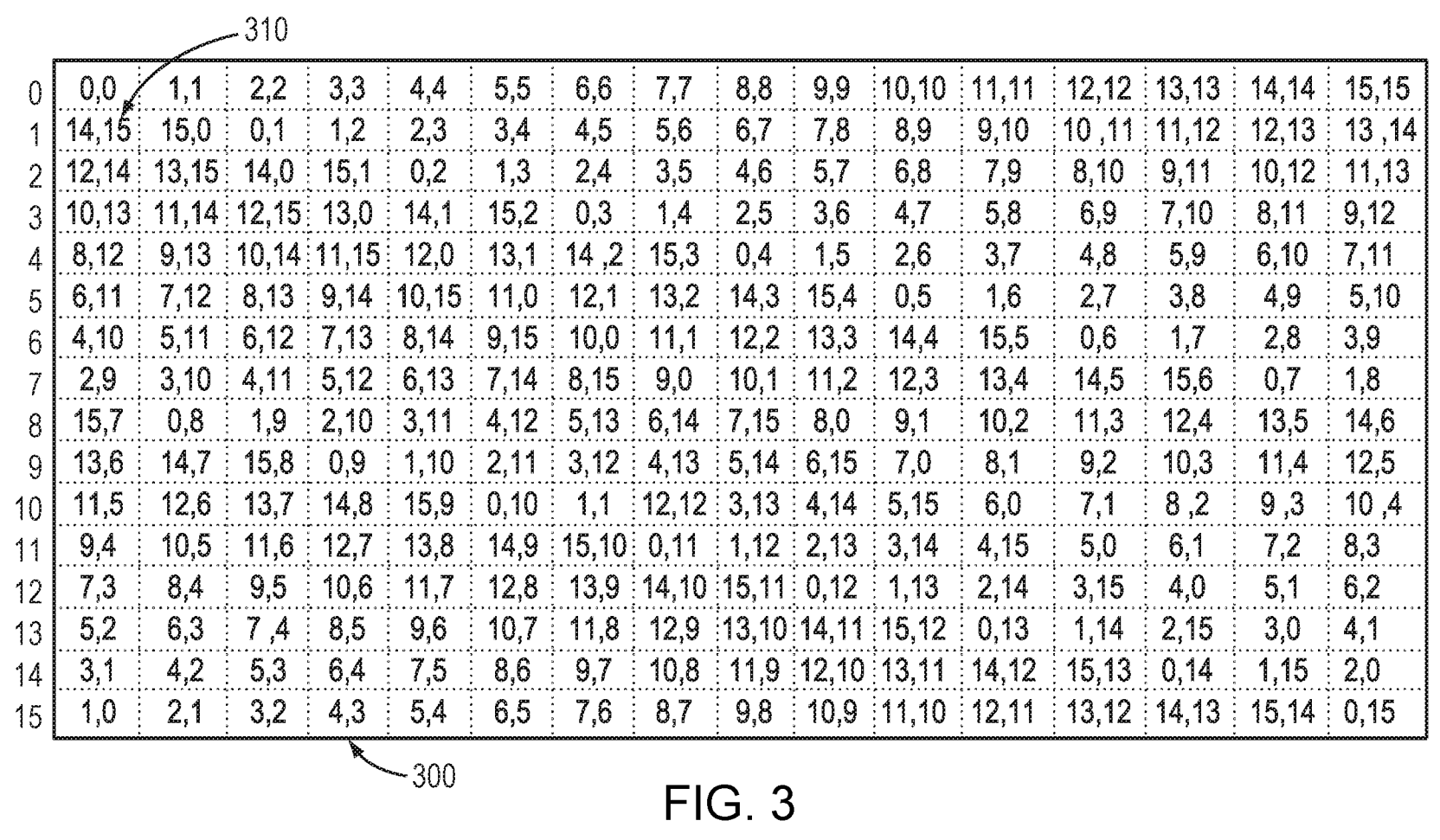

Refer now to the example embodiment of FIG. 3, which illustrates a mapping table for intra-block interleaving. The example embodiment of FIG. 3 is 16 by 16 table 300, that indicates the row and column of the source bit for each destination bit in the block. In FIG. 3, bit (14,15) 310 is an interleaver input bit received from an encoder output block. Bit (14, 15) 310 is placed in row 1 (base 0) of column 0 of a corresponding interleaver buffer block. In most embodiments, intra-block interleaving may be performed on the output of an encoder that is mapped into arrays of 16 by 16 bits. In certain embodiment herein, the mapping of FIG. 2 may be applied to each block in a buffer filled in by an encoder.

Figure 4:
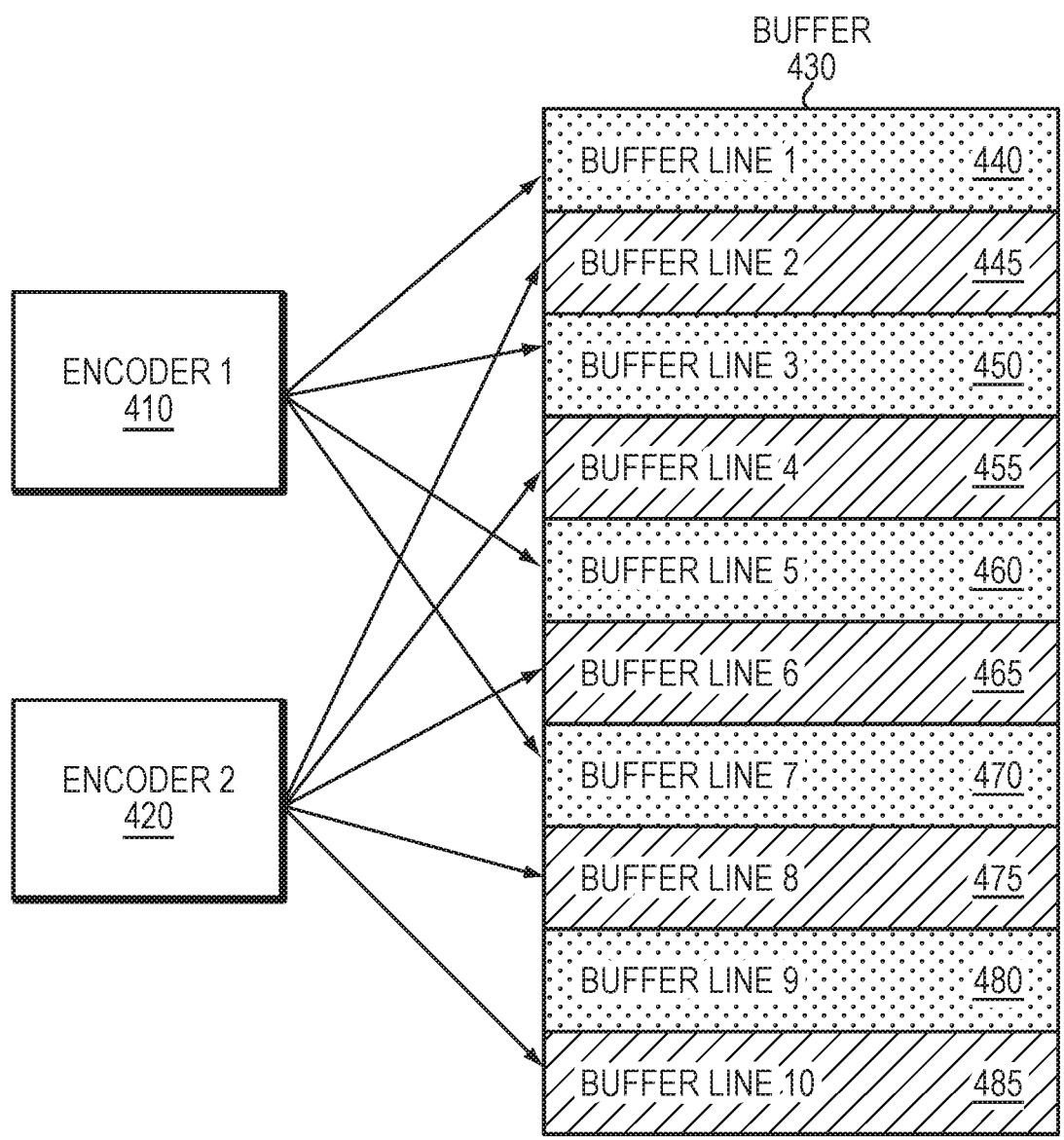
FIG. 4 is a simplified illustration of two encoders populating a buffer with data, in accordance with an embodiment of the present disclosure.

Refer now to the example embodiment if FIG. 4 that illustrates two half encoders. In the example embodiment of FIG. 4 encoder 1 410 and encoder 2 420 feed buffer 430. Encoder 1 410 and encoder 2 420 alternate filling lines in buffer 430. In this example embodiment, encoder 1 410 feeds alternative lines in buffer 430 such as buffer line 1 440, buffer line 3 450, buffer line 5 460, buffer line 7 470 and buffer line 9 480. In this example embodiment, encoder 2 430 feeds alternative lines in buffer 430 such as buffer line 2 445, buffer line 4 455, buffer line 6 465, buffer line 8 476 and buffer line 10 485. Each row block contains eight 16×16 blocks.

Refer now to the example embodiment of FIG. 5, which illustrates partitioning a buffer of an interleaver. In the example embodiment of FIG. 5, a buffer is divided into a top portion of 42 rows and a bottom portion of 42 rows. The top portion is represented as 2 subsets 0 and 1. The lower portion is represented as two subsets 2 and 3. Overall, in this embodiment, the buffer is divided into 4 parts, 0, 1, 2, and 3, by row blocks. For example, the first partition contains rows blocks 0, 2, . . . , 40 and the second partition contains row blocks 1, 3, . . . , 41. The third partition contains row blocks 42, 44, . . . , 82 and the fourth partition contains row blocks 43, 45, . . . 83. Each of the four subsets contains 21 by 8 blocks or 336 by 128 bits.

Figure 6:
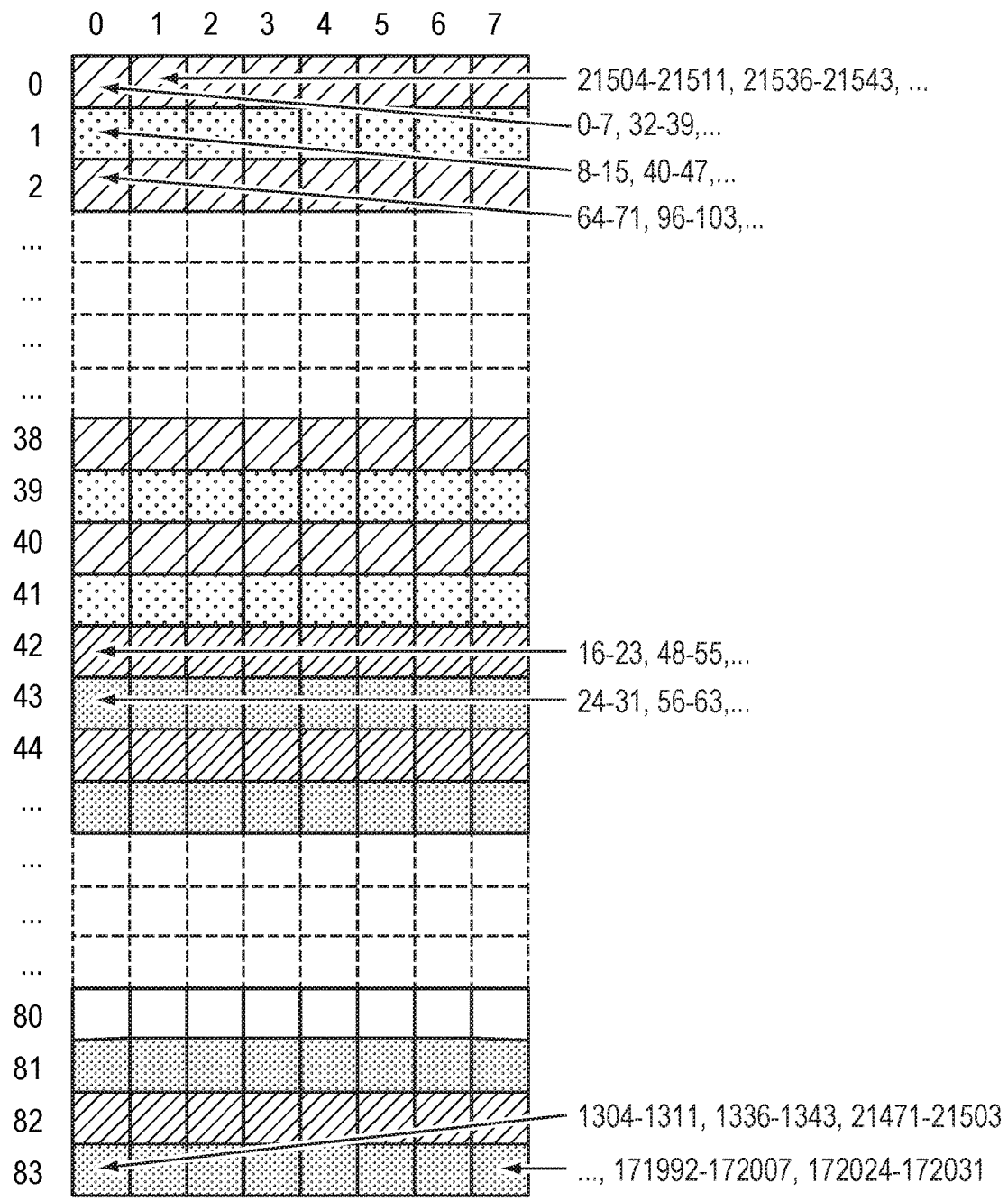
FIG. 6 is a simplified illustration of interblock interleaving, in accordance with an embodiment of the present disclosure.

Refer now to the example embodiment of FIG. 6, which illustrates reading rows from a buffer arranging the data to be sent to a modulator. In the example embodiment of FIG. 6, groups of 8 bits are taken in turn from each subset, reading them out of a column of bits before proceeding to the next columns of bits. For example, as shown in FIG. 1, the first 8 bits are read from the top of first column of subset 0, then the first 8 bits from the first column of subsets 1, 2 and 3. Those 32 bits are then followed by the taking the next 8 bits in the first column of each of the subsets 0, 1, 2 and 3. After 42 such cycles of 4×8 bits each, the first bit column of the interleaver buffer will be completely read out, and the output process continues by reading bit columns 1 to 127.

Figure 7:
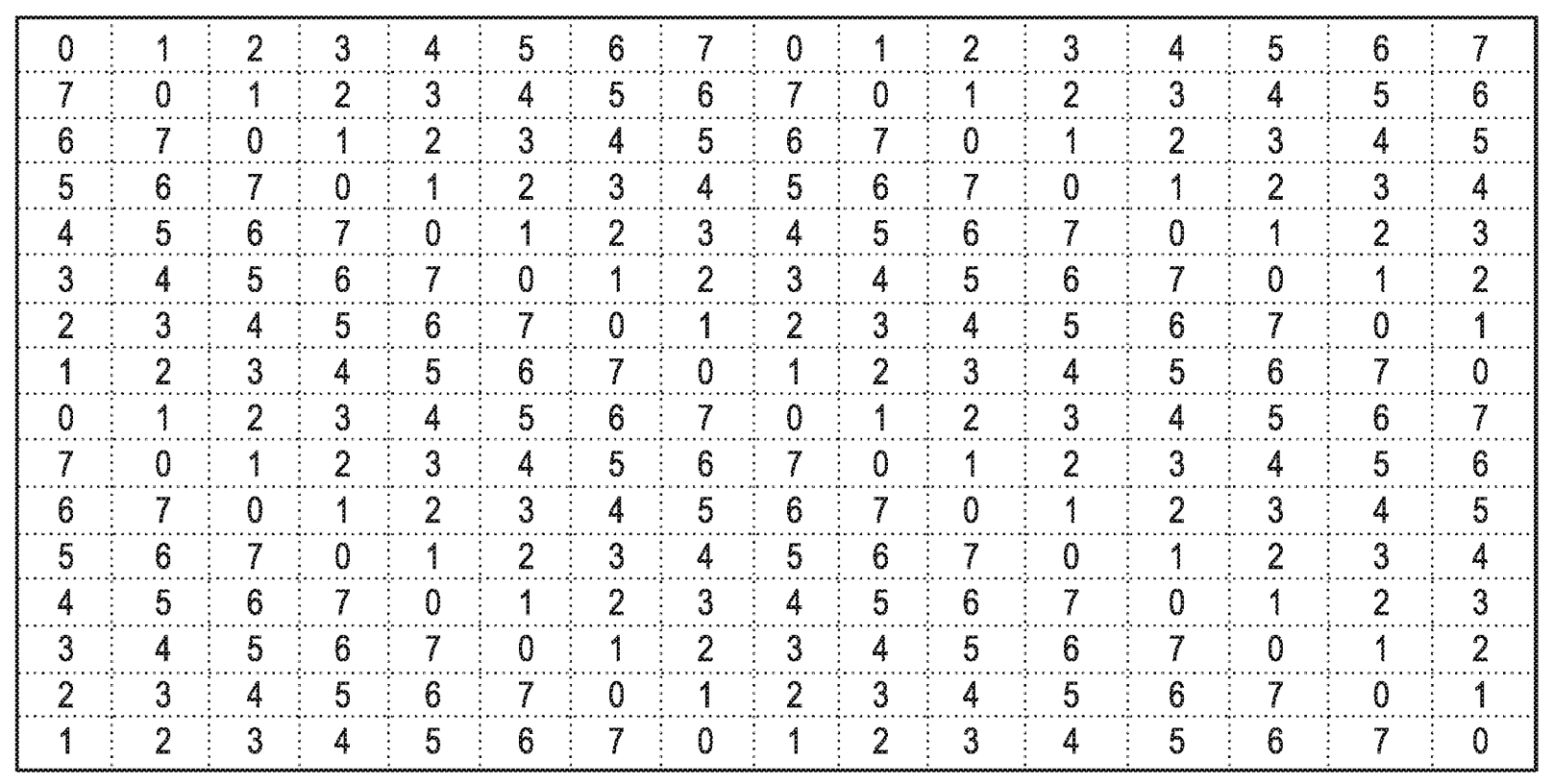

Refer now to the example embodiment of FIG. 7, which illustrates balancing symbol bits in each reliability class in each constituent codeword for 16 QAM. The table of FIG. 7 shows to which bit in a group of 8, each coded bit (before intra-block permutation) is mapped. Each row and each column is mapped uniformly on all possible positions. In this embodiment, this means that each constituent codeword is mapped uniformly to H and V symbols, and that for 16 QAM the bits in each constituent codeword are mapped uniformly to all reliability classes of symbol bits.

Figure 11:
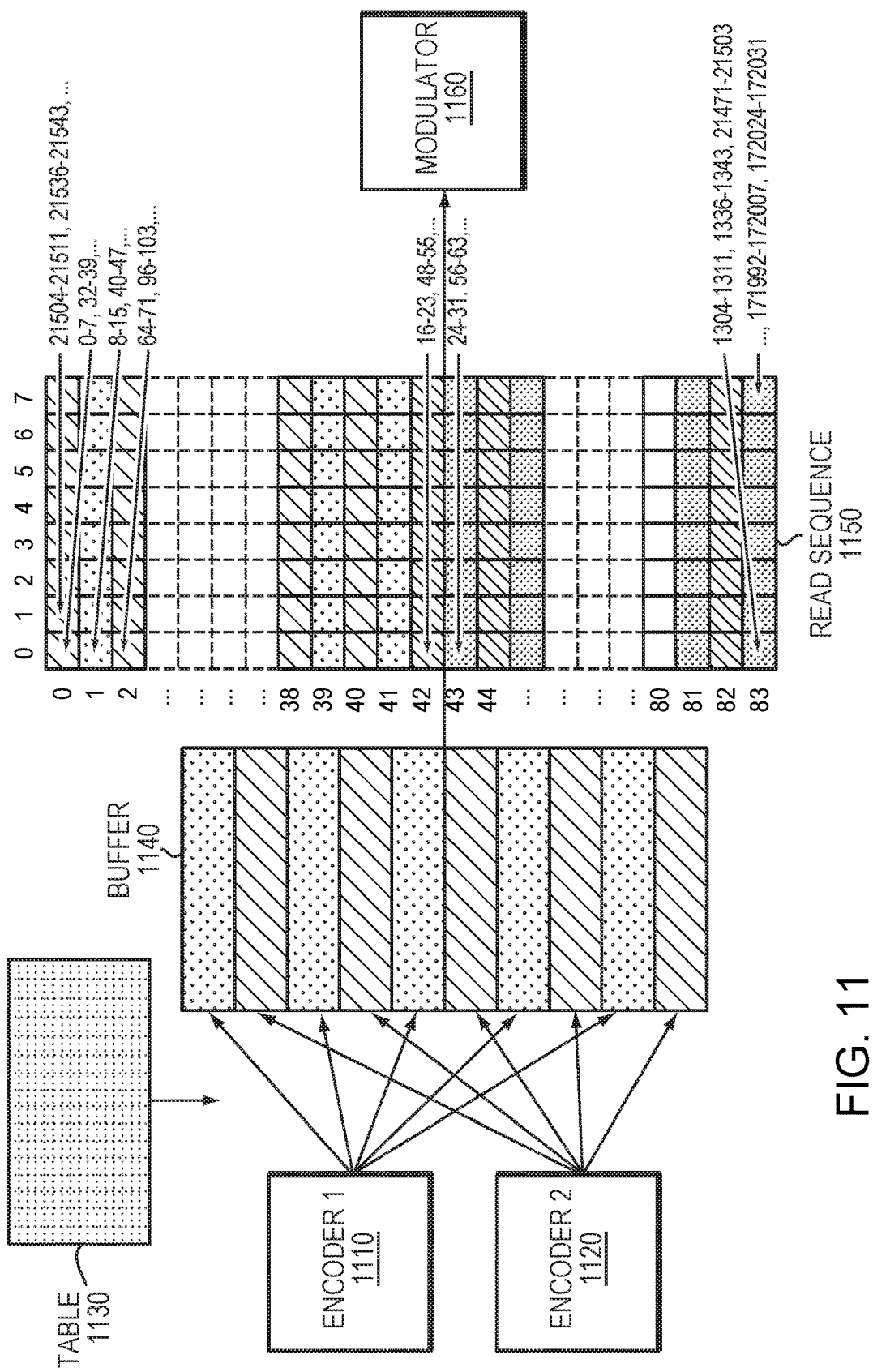
FIG. 11 is a simplified illustration of an interleaving system, in accordance with an embodiment of the present disclosure.

Refer now to the example embodiment of FIG. 8, which illustrates balancing symbol bits in each reliability class in each constituent codeword for QPSK. In this example embodiment, such a table is possible as the indices of transmission of the bits on the line, taken modulo, where N is twice the number of bits per symbol S, are the same in each block. The table of FIG. 11 shows to which of the 4 reliability classes, each coded bit (before intra-block permutation) is mapped. Each row and each column is mapped uniformly.

In most embodiments, such as for example in FIGS. 7 and 8, a table for balancing symbol bits in each reliability class in each constituent codeword may be possible when the indices of transmission of the bits on the line, taken modulo N, where N is twice the number of bits per symbol, are the same in each block.

Figure 10:
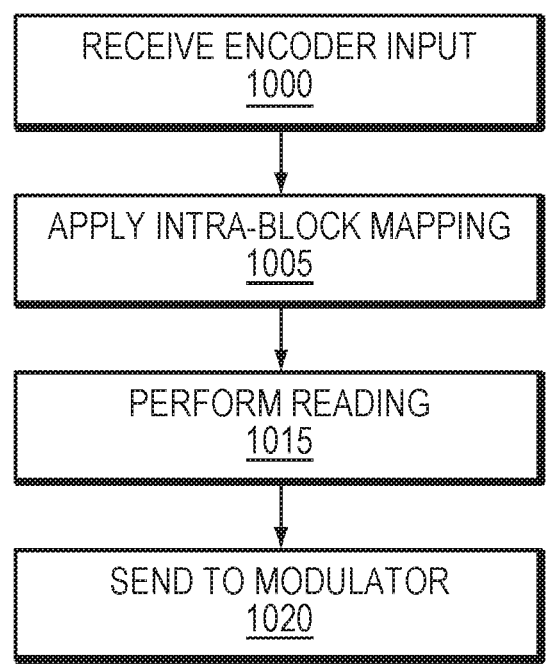
FIG. 10 is a simplified method for interleaving, in accordance with an embodiment of the present disclosure.

Refer now to the example embodiment of FIG. 9, which shows a table a mean, minimum, and maximum of occurrences of a bits in each reliability class in a constituent code for modulations of interest. In the table of FIG. 9, for QPSK, the mean, max, and min are 64. In the table of FIG. 9, for 8QAM, the mean is 42.66, the min is 37, and the max is 46. In the table of FIG. 9, for 16-QAM, the mean, max, and min are 32. Refer now to the example embodiments of FIGS. 10 and 11, which illustrate a sample interleaving process. Encoder input is received from encoders 0 1110 and encoder 1 1120 (step 1000). Intra block mapping is applied to the encoder input as it is read into buffer 1040 (step 1005). Buffer 1140 is read out according to read sequence 1150 (step 1015). The read out from buffer 1130 is sent to modulator 1160 (step 1020).

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. A method for interleaving data to facilitate correction of burst errors occurring during transmission of data, the method comprising:

creating a buffer having 172,032 bits arranged into an 84 by 8 array of 16 by 16 blocks; wherein the buffer is partitioned into 4 subsets of rows;

writing input data into each 16 by 16 block of arrays according to a table; wherein the table specifies the location of each bit in the 16 by 16 block based on the origin of the bit; and reading output data out of the buffer in groups of 8 bits; wherein each of the groups of 8 bits are taken in turn from each subset, in a column by column ordering; wherein arrangement of the output data facilitates correction of burst errors occurring during transmission of the output data.

2. The method of claim 1 where the first elements of the 16 by 16 table form a Latin square.

3. The method of claim 1 wherein the method is for interleaving data encoded using a 16 QAM modulation.

4. The method of claim 1 wherein the table is given by the following table:

| | | | | | | | | | | | | | | | |
|---|---|---|---|---|---|---|---|---|---|---|---|---|---|---|---|
| 0, 0 | 1, 1 | 2, 2 | 3, 3 | 4, 4 | 5, 5 | 6, 6 | 7, 7 | 8, 8 | 9, 9 | 10, 10 | 11, 11 | 12, 12 | 13, 13 | 14, 14 | 15, 15 |
| 14, 15 | 15, 0 | 0, 1 | 1, 2 | 2, 3 | 3, 4 | 4, 5 | 5, 6 | 6, 7 | 7, 8 | 8, 9 | 9, 10 | 10, 11 | 11, 12 | 12, 13 | 13, 14 |
| 12, 14 | 13, 15 | 14, 0 | 15, 1 | 0, 2 | 1, 3 | 2, 4 | 3, 5 | 4, 6 | 5, 7 | 6, 8 | 7, 9 | 8, 10 | 9, 11 | 10, 12 | 11, 13 |
| 10, 13 | 11, 14 | 12, 15 | 13, 0 | 14, 1 | 15, 2 | 0, 3 | 1, 4 | 2, 5 | 3, 6 | 4, 7 | 5, 8 | 6, 9 | 7, 10 | 8, 11 | 9, 12 |
| 8, 12 | 9, 13 | 10, 14 | 11, 15 | 12, 0 | 13, 1 | 14, 2 | 15, 3 | 0, 4 | 1, 5 | 2, 6 | 3, 7 | 4, 8 | 5, 9 | 6, 10 | 7, 11 |
| 6, 11 | 7, 12 | 8, 13 | 9, 14 | 10, 15 | 11, 0 | 12, 1 | 13, 2 | 14, 3 | 15, 4 | 0, 5 | 1, 6 | 2, 7 | 3, 8 | 4, 9 | 5, 10 |
| 4, 10 | 5, 11 | 6, 12 | 7, 13 | 8, 14 | 9, 15 | 10, 0 | 11, 1 | 12, 2 | 13, 3 | 14, 4 | 15, 5 | 0, 6 | 1, 7 | 2, 8 | 3, 9 |
| 2, 9 | 3, 10 | 4, 11 | 5, 12 | 6, 13 | 7, 14 | 8, 15 | 9, 0 | 10, 1 | 11, 2 | 12, 3 | 13, 4 | 14, 5 | 15, 6 | 0, 7 | 1, 8 |
| 15, 7 | 0, 8 | 1, 9 | 2, 10 | 3, 11 | 4, 12 | 5, 13 | 6, 14 | 7, 15 | 8, 0 | 9, 1 | 10, 2 | 11, 3 | 12, 4 | 13, 5 | 14, 6 |
| 13, 6 | 14, 7 | 15, 8 | 0, 9 | 1, 10 | 2, 11 | 3, 12 | 4, 13 | 5, 14 | 6, 15 | 7, 0 | 8, 1 | 9, 2 | 10, 3 | 11, 4 | 12, 5 |
| 11, 5 | 12, 6 | 13, 7 | 14, 8 | 15, 9 | 0, 10 | 1, 11 | 2, 12 | 3, 13 | 4, 14 | 5, 15 | 6, 0 | 7, 1 | 8, 2 | 9, 3 | 10, 4 |
| 9, 4 | 10, 5 | 11, 6 | 12, 7 | 13, 8 | 14, 9 | 15, 10 | 0, 11 | 1, 12 | 2, 13 | 3, 14 | 4, 15 | 5, 0 | 6, 1 | 7, 2 | 8, 3 |
| 7, 3 | 8, 4 | 9, 5 | 10, 6 | 11, 7 | 12, 8 | 13, 9 | 14, 10 | 15, 11 | 0, 12 | 1, 13 | 2, 14 | 3, 15 | 4, 0 | 5, 1 | 6, 2 |
| 5, 2 | 6, 3 | 7, 4 | 8, 5 | 9, 6 | 10, 7 | 11, 8 | 12, 9 | 13, 10 | 14, 11 | 15, 12 | 0, 13 | 1, 14 | 2, 15 | 3, 0 | 4, 1 |
| 3, 1 | 4, 2 | 5, 3 | 6, 4 | 7, 5 | 8, 6 | 9, 7 | 10, 8 | 11, 9 | 12, 10 | 13, 11 | 14, 12 | 15, 13 | 0, 14 | 1, 15 | 2, 0 |
| 1, 0 | 2, 1 | 3, 2 | 4, 3 | 5, 4 | 6, 5 | 7, 6 | 8, 7 | 9, 8 | 10, 9 | 11, 10 | 12, 11 | 13, 12 | 14, 13 | 15, 14 | 0, 15. |

5. The method of claim 1 wherein the method is for interleaving data encoded using QPSK modulation.

6. The method of claim 3 wherein symbol bits in each reliability class are balanced in each constituent codeword.

7. An apparatus comprising:

an interleaver; the interleaving containing logic enabling the interleaver to:

create a buffer having 172,032 bits arranged into an 84 by 8 array of 16 by 16 blocks; wherein the buffer is partitioned into 4 subsets of rows;

write input data into each 16 by 16 block of arrays according to a table; wherein the table specifies the location of each bit in the 16 by 16 block based on the origin of the bit; and read output data out of the buffer in groups of 8 bits; wherein each of the groups of 8 bits are taken in turn from each subset, in a column by column ordering; wherein arrangement of the output data facilitates correction of burst errors occurring during transmission of the output data.

8. The apparatus of claim 7 where the first elements of the 16 by 16 table form a Latin square.

9. The apparatus of claim 7 wherein a data modulation format for the data is for a 16 QAM modulation.

10. The apparatus of claim 7 wherein the table is given by the following table:

| 0,0 | 1,1 | 2,2 | 3,3 | 4,4 | 5,5 | 6,6 | 7,7 | 8,8 | 9,9 | 10,10 | 11,11 | 12,12 | 13,13 | 14,14 | 15,15 |
|---|---|---|---|---|---|---|---|---|---|---|---|---|---|---|---|
| 14,15 | 15,0 | 0,1 | 1,2 | 2,3 | 3,4 | 4,5 | 5,6 | 6,7 | 7,8 | 8,9 | 9,10 | 10,11 | 11,12 | 12,13 | 13,14 |
| 12,14 | 13,15 | 14,0 | 15,1 | 0,2 | 1,3 | 2,4 | 3,5 | 4,6 | 5,7 | 6,8 | 7,9 | 8,10 | 9,11 | 10,12 | 11,13 |
| 10,13 | 11,14 | 12,15 | 13,0 | 14,1 | 15,2 | 0,3 | 1,4 | 2,5 | 3,6 | 4,7 | 5,8 | 6,9 | 7,10 | 8,11 | 9,12 |
| 8,12 | 9,13 | 10,14 | 11,15 | 12,0 | 13,1 | 14,2 | 15,3 | 0,4 | 1,5 | 2,6 | 3,7 | 4,8 | 5,9 | 6,10 | 7,11 |
| 6,11 | 7,12 | 8,13 | 9,14 | 10,15 | 11,0 | 12,1 | 13,2 | 14,3 | 15,4 | 0,5 | 1,6 | 2,7 | 3,8 | 4,9 | 5,10 |
| 4,10 | 5,11 | 6,12 | 7,13 | 8,14 | 9,15 | 10,0 | 11,1 | 12,2 | 13,3 | 14,4 | 15,5 | 0,6 | 1,7 | 2,8 | 3,9 |
| 2,9 | 3,10 | 4,11 | 5,12 | 6,13 | 7,14 | 8,15 | 9,0 | 10,1 | 11,2 | 12,3 | 13,4 | 14,5 | 15,6 | 0,7 | 1,8 |
| 15,7 | 0,8 | 1,9 | 2,10 | 3,11 | 4,12 | 5,13 | 6,14 | 7,15 | 8,0 | 9,1 | 10,2 | 11,3 | 12,4 | 13,5 | 14,6 |
| 13,6 | 14,7 | 15,8 | 0,9 | 1,10 | 2,11 | 3,12 | 4,13 | 5,14 | 6,15 | 7,0 | 8,1 | 9,2 | 10,3 | 11,4 | 12,5 |
| 11,5 | 12,6 | 13,7 | 14,8 | 15,9 | 0,10 | 1,11 | 2,12 | 3,13 | 4,14 | 5,15 | 6,0 | 7,1 | 8,2 | 9,3 | 10,4 |
| 9,4 | 10,5 | 11,6 | 12,7 | 13,8 | 14,9 | 15,10 | 0,11 | 1,12 | 2,13 | 3,14 | 4,15 | 5,0 | 6,1 | 7,2 | 8,3 |
| 7,3 | 8,4 | 9,5 | 10,6 | 11,7 | 12,8 | 13,9 | 14,10 | 15,11 | 0,12 | 1,13 | 2,14 | 3,15 | 4,0 | 5,1 | 6,2 |
| 5,2 | 6,3 | 7,4 | 8,5 | 9,6 | 10,7 | 11,8 | 12,9 | 13,10 | 14,11 | 15,12 | 0,13 | 1,14 | 2,15 | 3,0 | 4,1 |
| 3,1 | 4,2 | 5,3 | 6,4 | 7,5 | 8,6 | 9,7 | 10,8 | 11,9 | 12,10 | 13,11 | 14,12 | 15,13 | 0,14 | 1,15 | 2,0 |
| 1,0 | 2,1 | 3,2 | 4,3 | 5,4 | 6,5 | 7,6 | 8,7 | 9,8 | 10,9 | 11,10 | 12,11 | 13,12 | 14,13 | 15,14 | 0,15. |

11. The apparatus of claim 7 wherein a data modulation format for the data is for a QPSK modulation.

12. The apparatus of claim 9 wherein symbol bits in each reliability class are balanced in each constituent codeword.

13. A system comprising:
one or more encoder;
an interleaver; the interleaver containing logic enabling the interleaver to:
create a buffer having 172,032 bits arranged into an 84 by 8 array of 16 by 16 blocks; wherein the buffer is partitioned into 4 subsets of rows;
write input data into each 16 by 16 block of arrays according to a table; wherein the table specifies the location of each bit in the 16 by 16 block based on the origin of the bit; and
read output data out of the buffer in groups of 8 bits; wherein each of the groups of 8 bits are taken in turn from each subset, in a column by column ordering; wherein arrangement of the output data facilitates correction of burst errors occurring during transmission of the output data.

14. The system of claim 13 wherein the one or more encoders provide data to the interleaver to populate the buffer; wherein the one or more encoders switch between providing data to the interleaver.

15. The system of claim 13 where the first elements of the 16 by 16 table form a Latin square.

16. The system of claim 13 wherein a data modulation format for the data is for a 16 QAM modulation.

17. The system of claim 13 wherein the table is given by the following table:

| 0,0 | 1,1 | 2,2 | 3,3 | 4,4 | 5,5 | 6,6 | 7,7 | 8,8 | 9,9 | 10,10 | 11,11 | 12,12 | 13,13 | 14,14 | 15,15 |
|---|---|---|---|---|---|---|---|---|---|---|---|---|---|---|---|
| 14,15 | 15,0 | 0,1 | 1,2 | 2,3 | 3,4 | 4,5 | 5,6 | 6,7 | 7,8 | 8,9 | 9,10 | 10,11 | 11,12 | 12,13 | 13,14 |
| 12,14 | 13,15 | 14,0 | 15,1 | 0,2 | 1,3 | 2,4 | 3,5 | 4,6 | 5,7 | 6,8 | 7,9 | 8,10 | 9,11 | 10,12 | 11,13 |
| 10,13 | 11,14 | 12,15 | 13,0 | 14,1 | 15,2 | 0,3 | 1,4 | 2,5 | 3,6 | 4,7 | 5,8 | 6,9 | 7,10 | 8,11 | 9,12 |
| 8,12 | 9,13 | 10,14 | 11,15 | 12,0 | 13,1 | 14,2 | 15,3 | 0,4 | 1,5 | 2,6 | 3,7 | 4,8 | 5,9 | 6,10 | 7,11 |
| 6,11 | 7,12 | 8,13 | 9,14 | 10,15 | 11,0 | 12,1 | 13,2 | 14,3 | 15,4 | 0,5 | 1,6 | 2,7 | 3,8 | 4,9 | 5,10 |
| 4,10 | 5,11 | 6,12 | 7,13 | 8,14 | 9,15 | 10,0 | 11,1 | 12,2 | 13,3 | 14,4 | 15,5 | 0,6 | 1,7 | 2,8 | 3,9 |
| 2,9 | 3,10 | 4,11 | 5,12 | 6,13 | 7,14 | 8,15 | 9,0 | 10,1 | 11,2 | 12,3 | 13,4 | 14,5 | 15,6 | 0,7 | 1,8 |
| 15,7 | 0,8 | 1,9 | 2,10 | 3,11 | 4,12 | 5,13 | 6,14 | 7,15 | 8,0 | 9,1 | 10,2 | 11,3 | 12,4 | 13,5 | 14,6 |
| 13,6 | 14,7 | 15,8 | 0,9 | 1,10 | 2,11 | 3,12 | 4,13 | 5,14 | 6,15 | 7,0 | 8,1 | 9,2 | 10,3 | 11,4 | 12,5 |
| 11,5 | 12,6 | 13,7 | 14,8 | 15,9 | 0,10 | 1,11 | 2,12 | 3,13 | 4,14 | 5,15 | 6,0 | 7,1 | 8,2 | 9,3 | 10,4 |
| 9,4 | 10,5 | 11,6 | 12,7 | 13,8 | 14,9 | 15,10 | 0,11 | 1,12 | 2,13 | 3,14 | 4,15 | 5,0 | 6,1 | 7,2 | 8,3 |
| 7,3 | 8,4 | 9,5 | 10,6 | 11,7 | 12,8 | 13,9 | 14,10 | 15,11 | 0,12 | 1,13 | 2,14 | 3,15 | 4,0 | 5,1 | 6,2 |
| 5,2 | 6,3 | 7,4 | 8,5 | 9,6 | 10,7 | 11,8 | 12,9 | 13,10 | 14,11 | 15,12 | 0,13 | 1,14 | 2,15 | 3,0 | 4,1 |
| 3,1 | 4,2 | 5,3 | 6,4 | 7,5 | 8,6 | 9,7 | 10,8 | 11,9 | 12,10 | 13,11 | 14,12 | 15,13 | 0,14 | 1,15 | 2,0 |
| 1,0 | 2,1 | 3,2 | 4,3 | 5,4 | 6,5 | 7,6 | 8,7 | 9,8 | 10,9 | 11,10 | 12,11 | 13,12 | 14,13 | 15,14 | 0,15. |

18. The system of claim 13 wherein a data modulation format for the data is for a QPSK modulation.

19. The method of claim 1 wherein the method is for interleaving data encoded using 8 QAM modulation.

20. The system of claim 13 wherein a data modulation format for the data is for a 8 QAM modulation.

\* \* \* \* \*